US011217368B2

(12) United States Patent
Choa et al.

(10) Patent No.: US 11,217,368 B2
(45) Date of Patent: Jan. 4, 2022

(54) NANOSTRUCTURE NETWORK AND METHOD OF FABRICATING THE SAME

(71) Applicant: INDUSTRY-UNIVERSITY COOPERATION FOUNDATION HANYANG UNIVERSITY ERICA CAMPUS, Ansan-si (KR)

(72) Inventors: Yong-Ho Choa, Seongnam-si (KR); Young Tae Kwon, Ansan-si (KR); Seung Han Ryu, Ansan-si (KR)

(73) Assignee: INDUSTRY-UNIVERSITY COOPERATION FOUNDATION HANYANG UNIVERSITY ERICA CAMPUS, Ansan-si (KR)

( * ) Notice: Subject to any disclaimer, the term of this patent is extended or adjusted under 35 U.S.C. 154(b) by 262 days.

(21) Appl. No.: 16/235,800

(22) Filed: Dec. 28, 2018

(65) Prior Publication Data
US 2019/0139680 A1    May 9, 2019

Related U.S. Application Data

(63) Continuation of application No. PCT/KR2017/000260, filed on Jan. 9, 2017.

(30) Foreign Application Priority Data

Jun. 29, 2016  (KR) .......................... 10-2016-0081521
Nov. 1, 2016   (KR) .......................... 10-2016-0144183

(51) Int. Cl.
*H01L 31/18*    (2006.01)
*H01B 1/02*     (2006.01)
(Continued)

(52) U.S. Cl.
CPC .......... *H01B 13/0026* (2013.01); *B05D 5/06* (2013.01); *H01B 1/02* (2013.01); *H01B 1/08* (2013.01);
(Continued)

(58) Field of Classification Search
CPC .... H01B 1/02; H01B 5/14; B05D 5/06; H01L 31/022466; H01L 33/58; H01L 31/0033;
(Continued)

(56) References Cited

U.S. PATENT DOCUMENTS

2004/0202682 A1 * 10/2004 Emrick .................... B01J 13/14
424/400
2005/0214480 A1 *  9/2005 Garbar ................... H05K 1/097
428/1.1
(Continued)

FOREIGN PATENT DOCUMENTS

JP    2007-512412 A    5/2007
KR  10-2006-0012542 A   2/2006
(Continued)

OTHER PUBLICATIONS

International Search Report for PCT/KR2017/000260 dated Apr. 20, 2017 [PCT/ISA/210].

*Primary Examiner* — Tri V Nguyen
(74) *Attorney, Agent, or Firm* — Sughrue Mion, PLLC

(57) ABSTRACT

Provided are a nanostructure network and a method of fabricating the same. The nanostructure network includes nanostructures having a poly-crystalline structure formed by self-assembly of the nanostructures. The method includes preparing a nanostructure solution in which nanostructures are dispersed in a first solvent, forming a nanostructure ink by adding the nanostructure solution into a second solvent having a viscosity higher than that of the first solvent, coating a surface of a substrate with the nanostructure ink, and forming a nanostructure network by evaporating the first solvent and the second solvent included in the nanostructure ink coated on the substrate.

17 Claims, 16 Drawing Sheets
(4 of 16 Drawing Sheet(s) Filed in Color)

(51) Int. Cl.
*H01L 51/00* (2006.01)
*H01B 13/00* (2006.01)
*H01B 5/14* (2006.01)
*H01B 1/08* (2006.01)
*B05D 5/06* (2006.01)

(52) U.S. Cl.
CPC ............ *H01B 5/14* (2013.01); *H01B 13/0036* (2013.01); *H01L 31/1884* (2013.01); *H01L 51/0005* (2013.01); *H01L 51/0022* (2013.01)

(58) Field of Classification Search
CPC ............ H01L 31/1884; H01L 51/0022; H01L 51/0005
USPC ............................ 106/31.13, 31.33; 427/123
See application file for complete search history.

(56) References Cited

U.S. PATENT DOCUMENTS

| | | | | |
|---|---|---|---|---|
| 2008/0152872 | A1* | 6/2008 | Chabinyc | H01L 51/0048 428/195.1 |
| 2011/0318905 | A1* | 12/2011 | Chiruvolu | C01B 33/02 438/478 |
| 2012/0097059 | A1* | 4/2012 | Allemand | C09D 11/52 101/483 |
| 2013/0099179 | A1* | 4/2013 | Vanheusden | H01B 1/22 252/514 |
| 2017/0253757 | A1* | 9/2017 | Salami | C09D 11/033 |

FOREIGN PATENT DOCUMENTS

| | | | | |
|---|---|---|---|---|
| KR | 10-2012-0010465 A | 2/2012 | | |
| KR | 10-1518875 B1 | 5/2015 | | |
| KR | 10-1522225 B1 | 5/2015 | | |
| KR | 10-1535725 B1 | 7/2015 | | |
| KR | 10-2016-0004846 A | 1/2016 | | |
| KR | 10-2016-0032302 A | 3/2016 | | |
| KR | 10201600032302 A1 * | 3/2016 | ............ | B32B 27/06 |

\* cited by examiner

[FIG. 1]
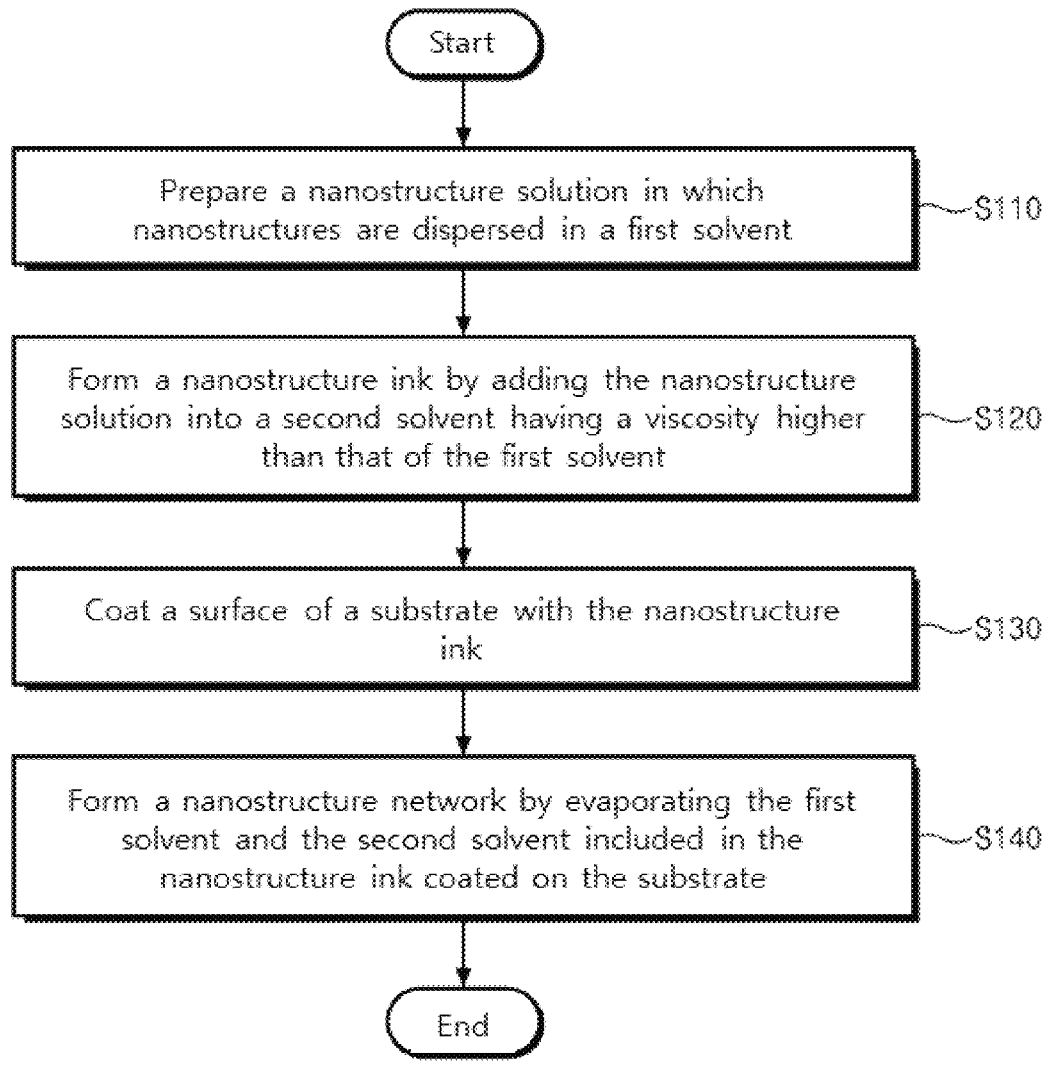

[FIG. 2A]
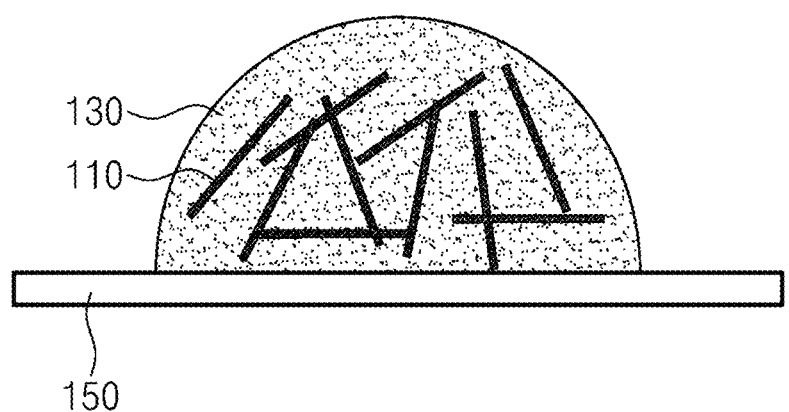

[FIG. 2B]
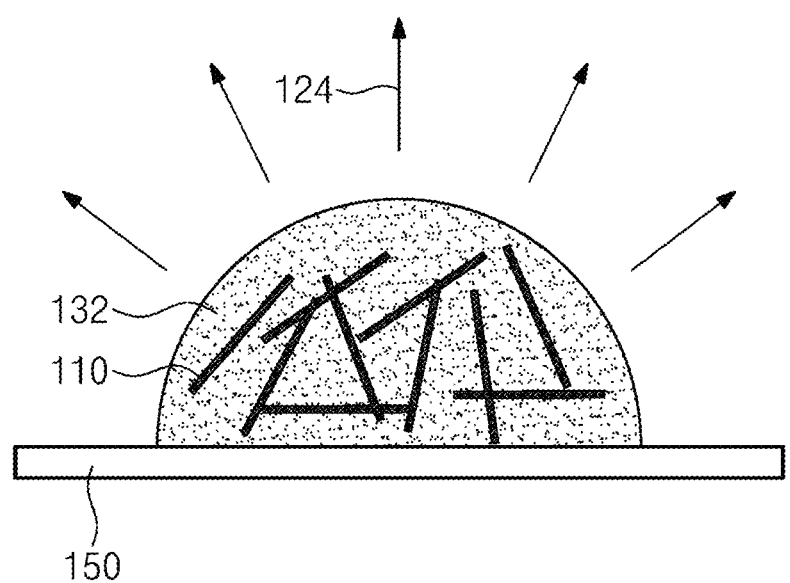

[FIG. 2C]
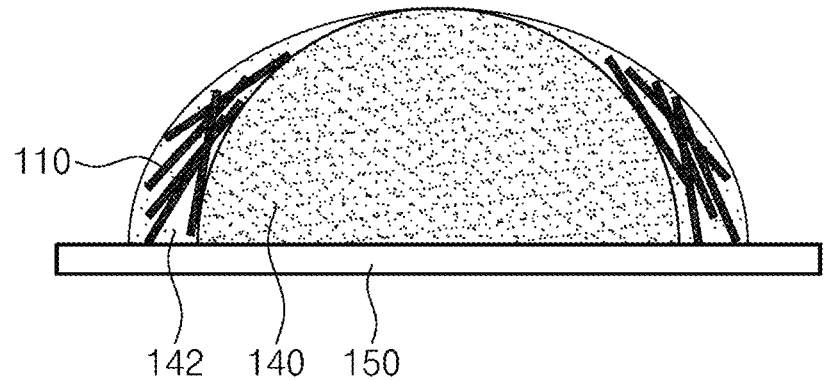
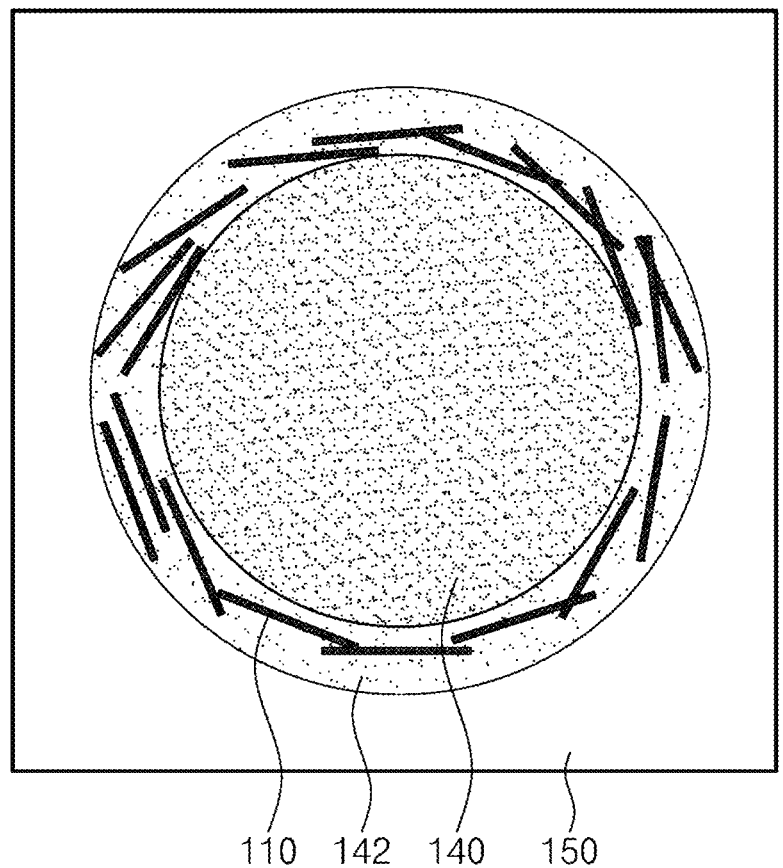

[FIG. 2D]
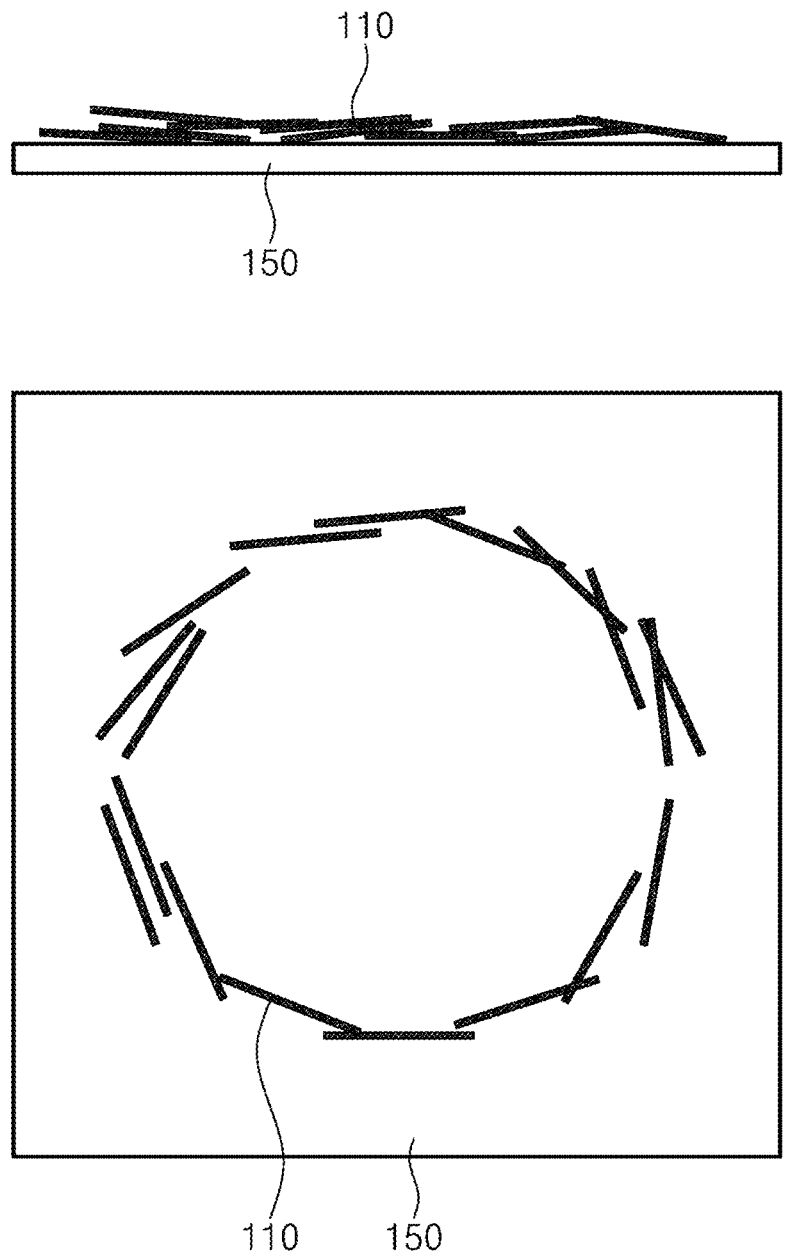

[FIG. 3]
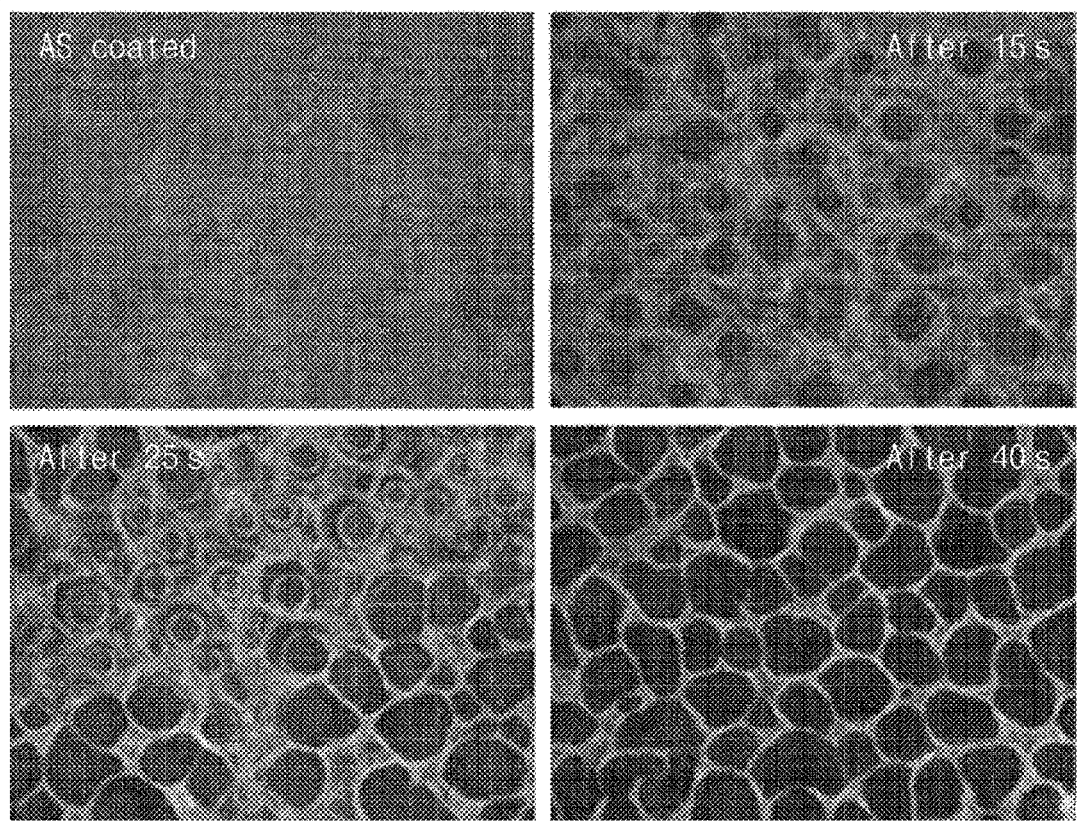

[FIG. 4]
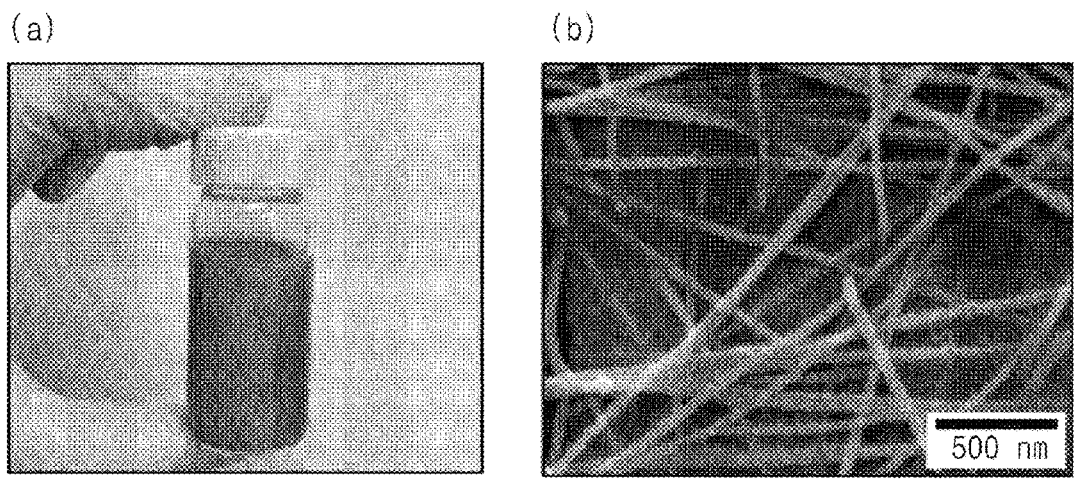

[FIG. 5]
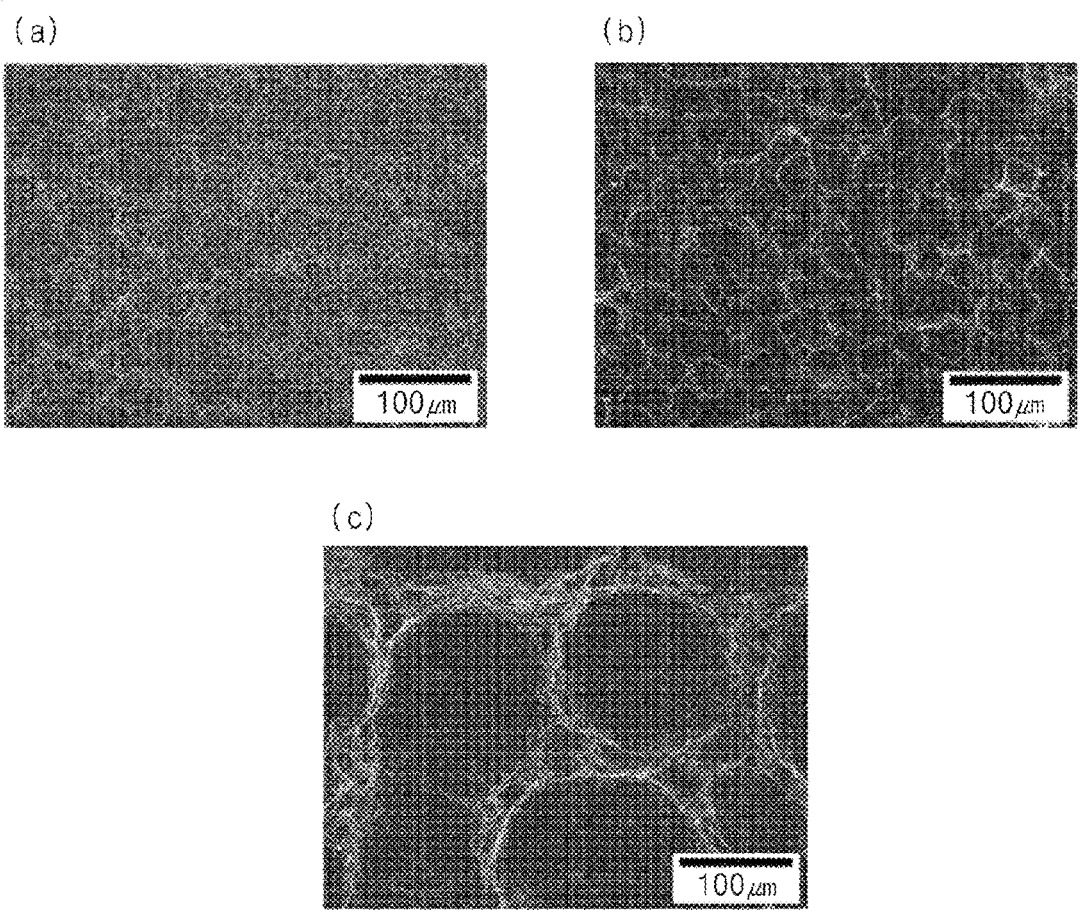

[FIG. 6]
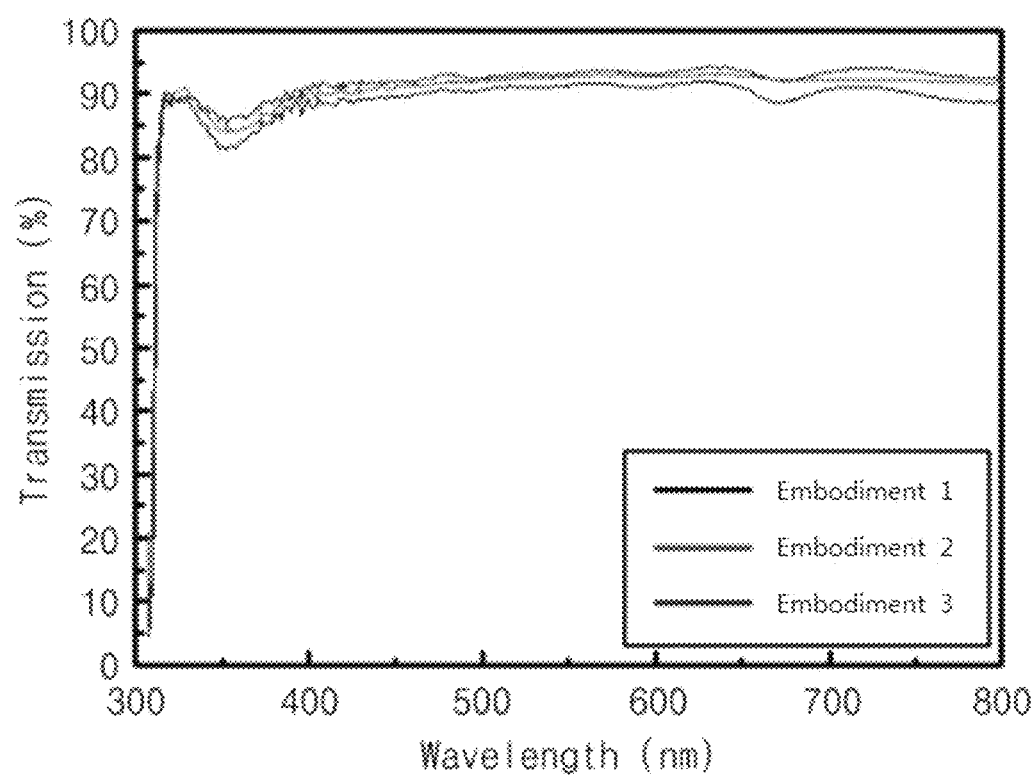

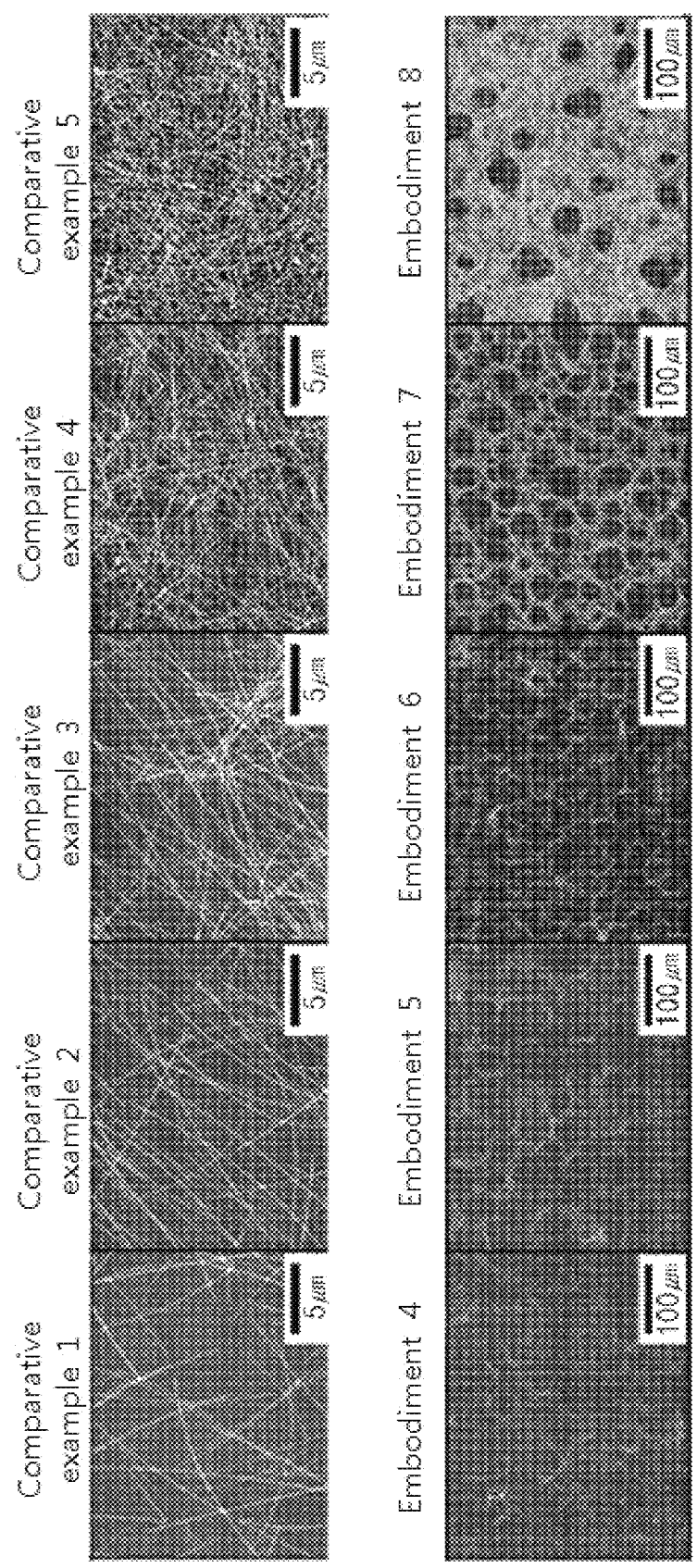
[FIG. 7]

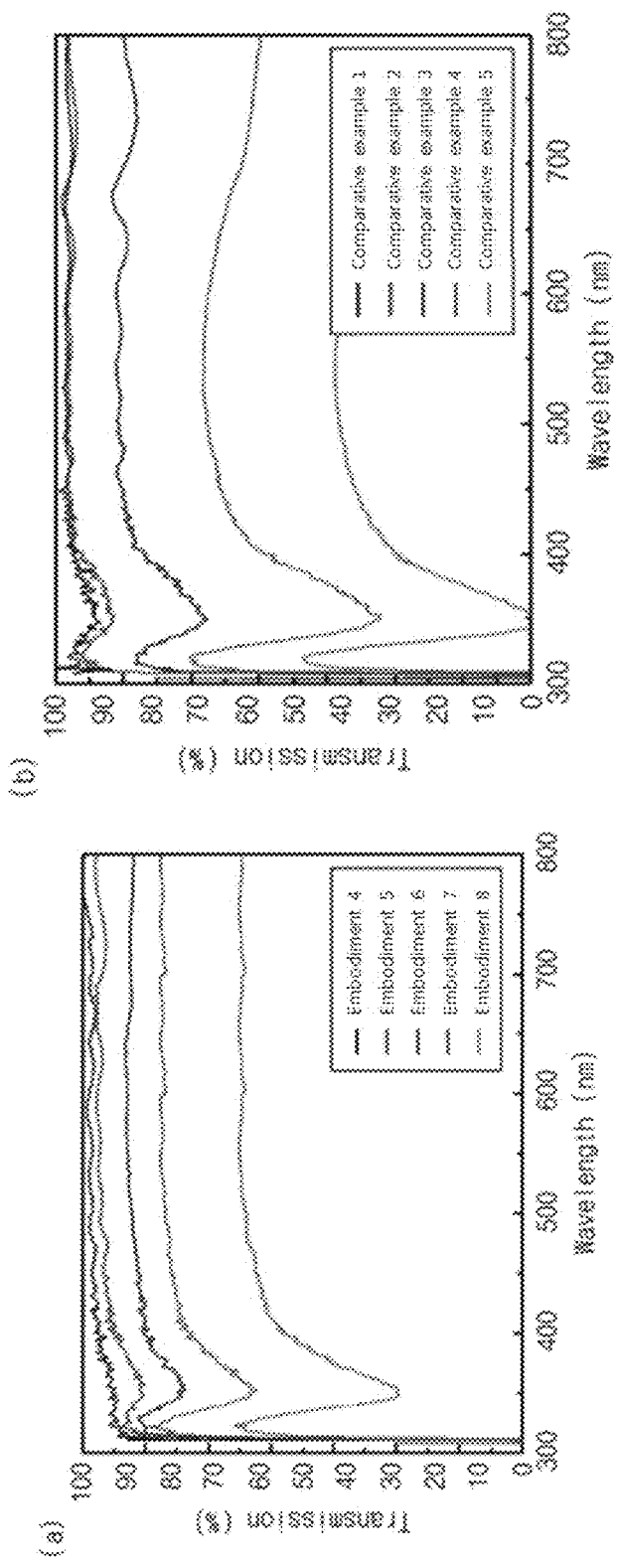
[FIG. 8]

[FIG. 9]
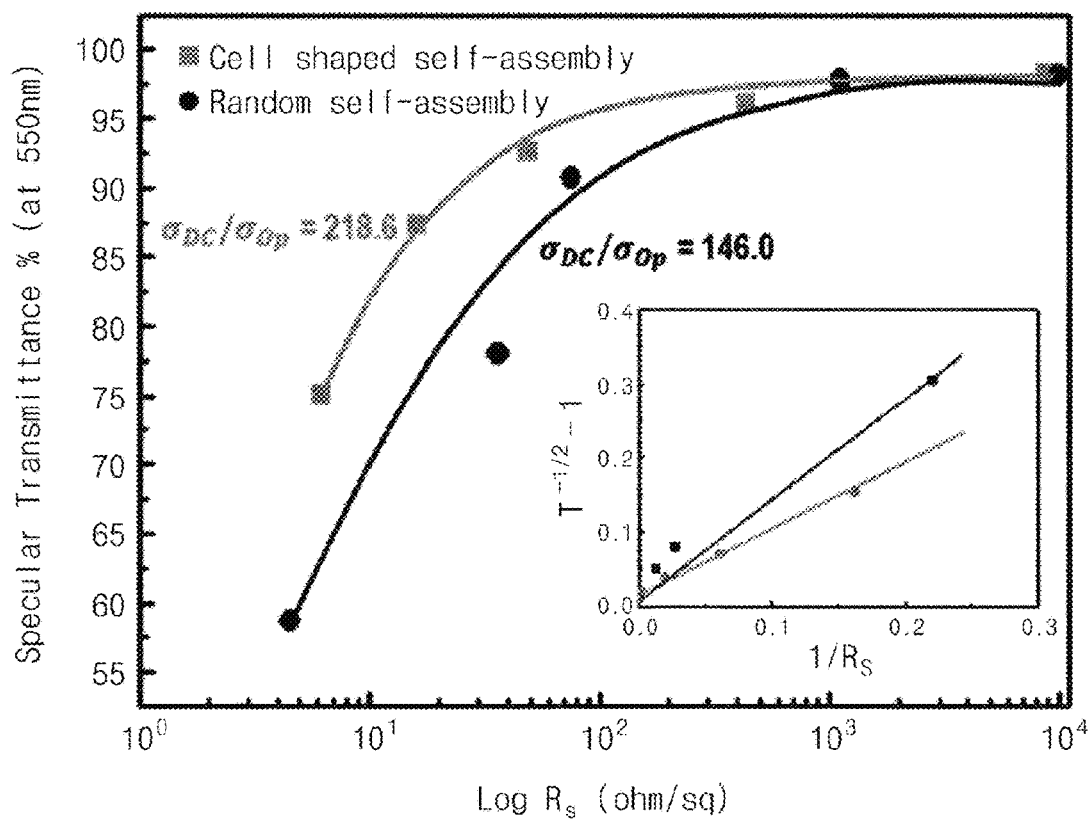

[FIG. 10]
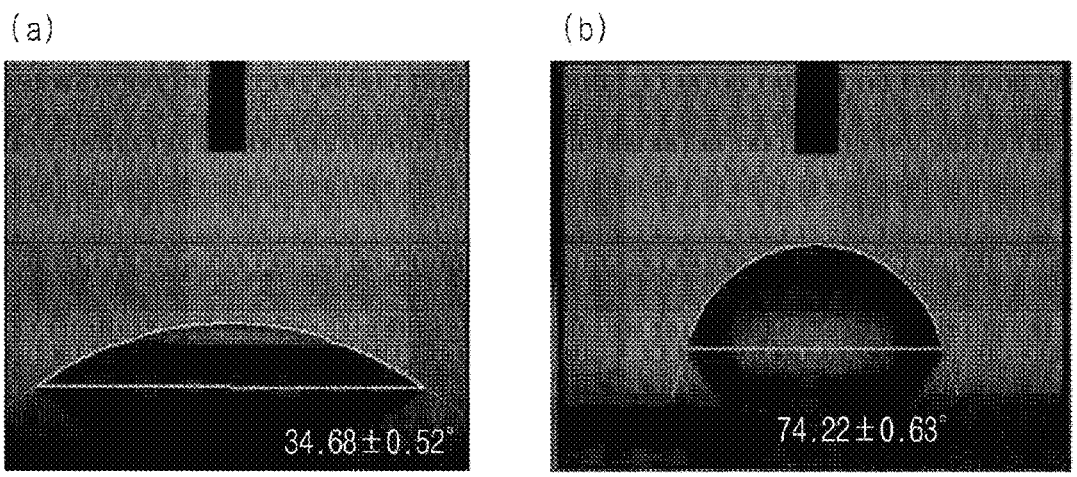

[FIG. 11]
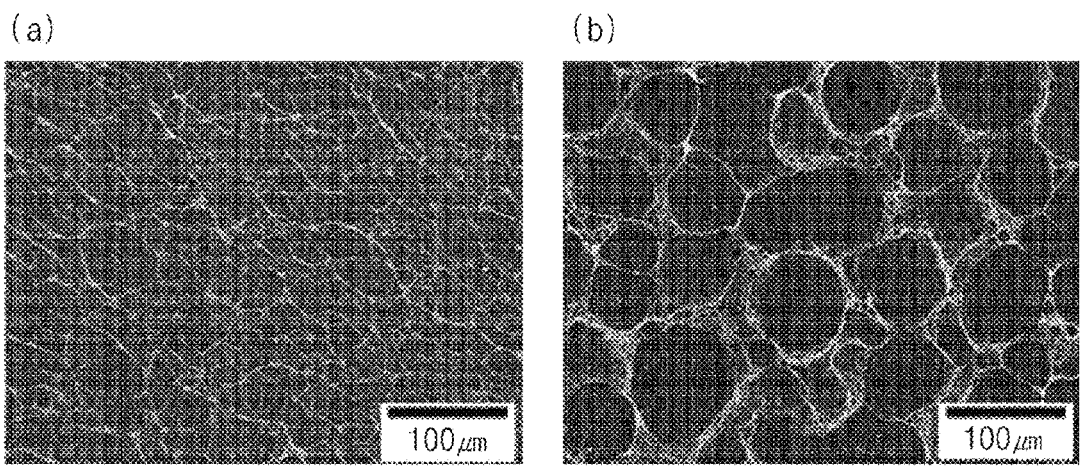

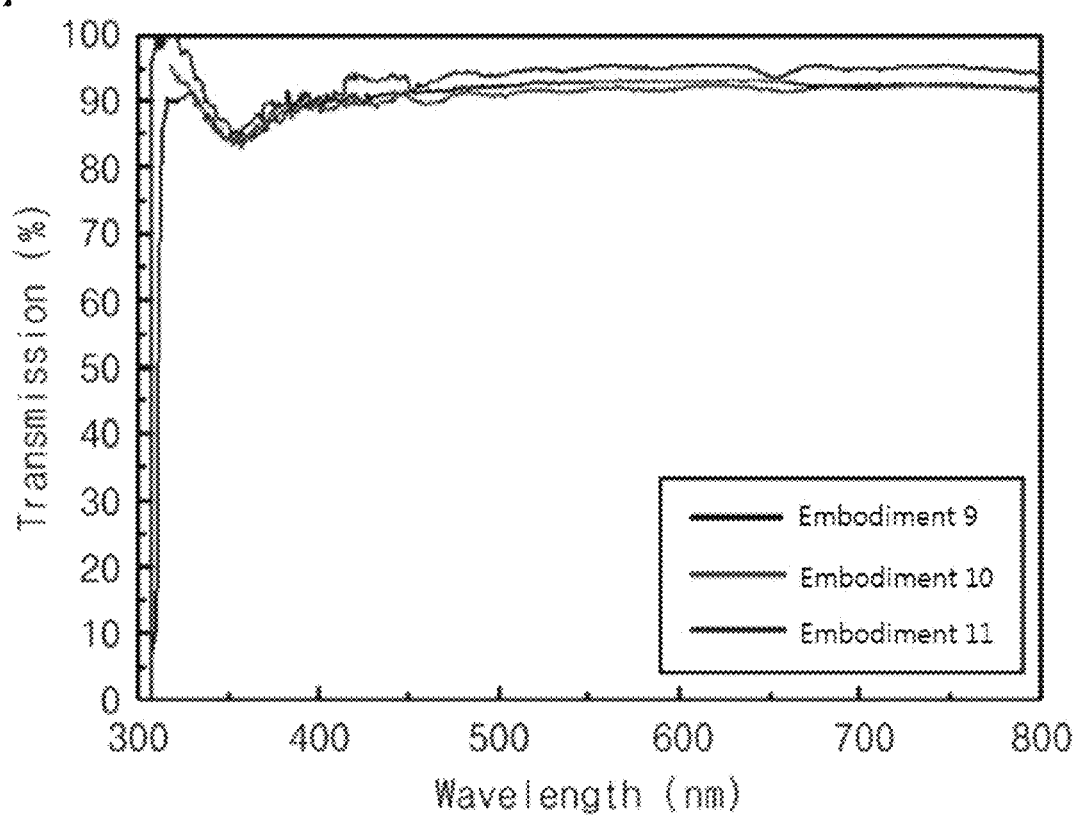
[FIG. 12]

[FIG. 13]
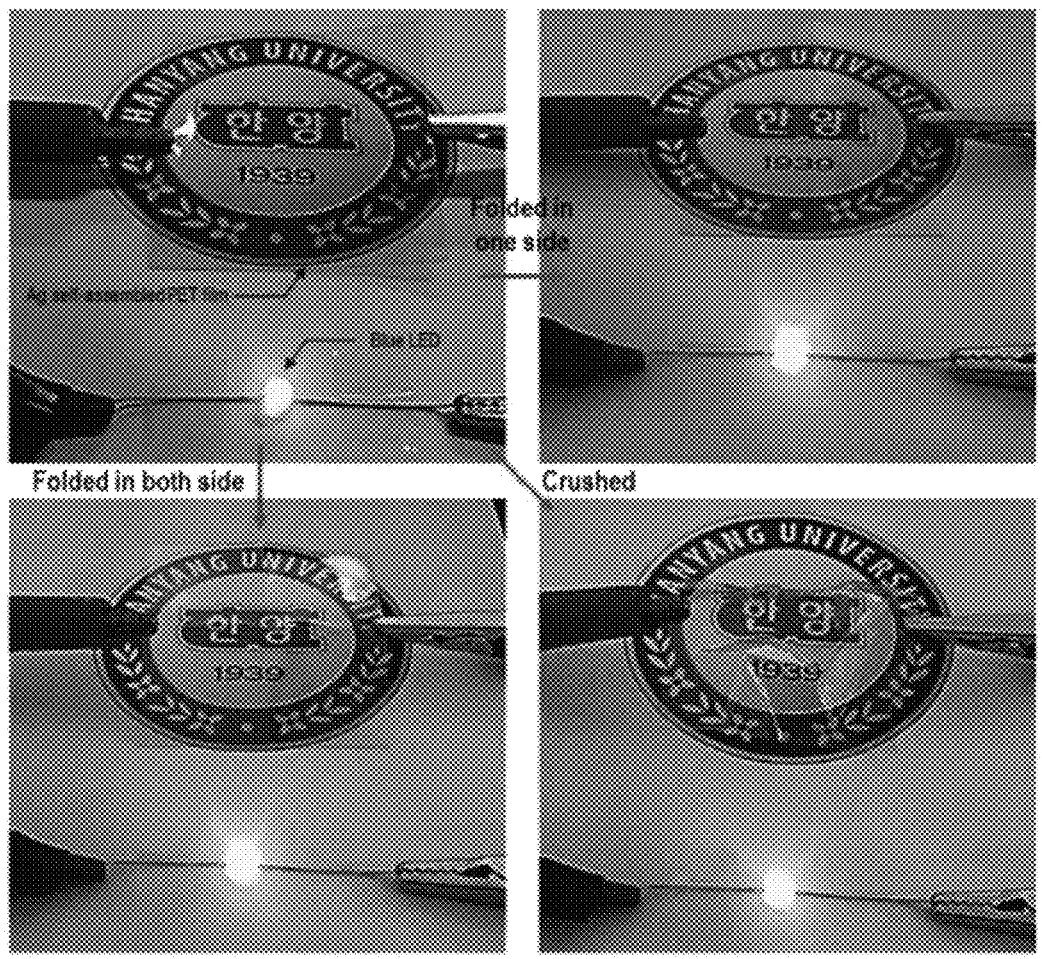

NANOSTRUCTURE NETWORK AND METHOD OF FABRICATING THE SAME

CROSS-REFERENCE TO RELATED APPLICATION

This application is a continuation of pending International Application No. PCT/KR2017/000260, which was filed on Jan. 9, 2017 and claims priority to Korean Patent Application Nos. 10-2016-0081521 and 10-2016-0144183, filed on Jun. 29, 2016 and Nov. 1, 2016, in the Korean Intellectual Property Office, the disclosures of which are hereby incorporated by reference in their entireties.

BACKGROUND

1. Field

The present disclosure herein relates to a nanostructure network and a method of fabricating the same, and more particularly, to a nanostructure network having a poly-crystalline structure formed by self-assembly of nanostructures, and a method of fabricating the same.

2. Description of the Related Art

A transparent electrode may be used in a field requiring an electrode capable of transmitting light, such as a light emitting display device. The transparent electrode may be fabricated by forming a thin film electrode having a high light transmittance on a surface of an insulating material having a high light transmittance. Currently, indium tin oxide (ITO) is widely used as a material of the transparent electrode. However, the ITO has a limited amount of resources thereof, and it may be difficult to apply the ITO to a flexible display device actively studied recently.

A transparent electrode using a silver nanostructure, which is being studied as a substitute for the ITO transparent electrode, may have excellent electrical conductivity, transmittance and durability and may also have high productivity due to simple fabricating process and apparatus. Thus, price competitiveness of the transparent electrode using the silver nanostructure may be superior to that of the ITO transparent electrode. In addition, due to a thin and long shape of the silver nanostructure, the transparent electrode using the silver nanostructure may not be broken even if bent. Thus, the transparent electrode using the silver nanostructure may be used as a flexible transparent electrode.

Accordingly, methods for fabricating a transparent electrode using the silver nanostructure have been actively studied.

SUMMARY

The present disclosure may provide a method of fabricating a nanostructure network having a poly-crystalline structure.

The present disclosure may also provide a method of fabricating a nanostructure network in which a plurality of cell shapes is formed.

The present disclosure may further provide a method of fabricating a nanostructure network with improved transmittance.

The present disclosure may further provide a method of fabricating a nanostructure network, which is capable of reducing a fabrication time.

The present disclosure may further provide a method of fabricating a nanostructure network, which is capable of simplifying fabrication processes.

In an aspect, a method of fabricating a nanostructure network, the method may include preparing a nanostructure solution in which nanostructures are dispersed in a first solvent, forming a nanostructure ink by adding the nanostructure solution into a second solvent having a viscosity higher than that of the first solvent, coating a surface of a substrate with the nanostructure ink, and forming a nanostructure network by evaporating the first solvent and the second solvent included in the nanostructure ink coated on the substrate.

In an embodiment, a vapor pressure of the first solvent may be higher than a vapor pressure of the second solvent.

In an embodiment, the forming of the nanostructure ink may include adding an admixture for mixing the first solvent and the second solvent to the second solvent. A vapor pressure of the admixture may be higher than vapor pressures of the first solvent and the second solvent.

In an embodiment, the coating of the surface of the substrate with the nanostructure ink may include generating a coating layer in a liquid state on the substrate, and dividing the coating layer into a plurality of first droplets spaced apart from each other.

In an embodiment, the forming of the nanostructure network may include evaporating the admixture prior to the first solvent and the second solvent from the first droplet to form a second droplet, evaporating the first solvent prior to the second solvent from the second droplet to form a third droplet, and evaporating the second solvent from the third droplet.

In an embodiment, the second droplet may include a central portion and a peripheral portion. A concentration of the first solvent may be lower than a concentration of the second solvent in the central portion, and a concentration of the first solvent may be higher than a concentration of the second solvent in the peripheral portion. A concentration of the nanostructures in the peripheral portion may be higher than a concentration of the nanostructures in the central portion.

In an embodiment, an affinity between the first solvent and the nanostructures may be higher than an affinity between the second solvent and the nano structures.

In an embodiment, the evaporating of the admixture prior to the first solvent and the second solvent from the first droplet to form the second droplet may include concentrating the nanostructures to an edge of the second droplet by a difference in affinity between the first solvent and the second solvent for the nano structures.

In an embodiment, the nanostructures may be self-assembled into a poly-crystalline structure while forming a plurality of cell shapes, thereby forming the nanostructure network. An average size of the plurality of cells may be adjusted by a content or the viscosity of the second solvent.

In an embodiment, the average size of the plurality of cells may increase as the content of the second solvent increases, and the average size of the plurality of cells may decrease as the content of the second solvent decreases.

In an embodiment, the average size of the plurality of cells may decrease as the viscosity of the second solvent increases, and the average size of the plurality of cells may increase as the viscosity of the second solvent decreases.

In an embodiment, the method may further include pre-treating the surface of the substrate to convert the surface into a hydrophilic surface, before the coating of the surface of the substrate with the nanostructure ink.

In an embodiment, the surface of the substrate may be pretreated with oxygen plasma.

In an embodiment, the second solvent may include α-terpineol, cyclohexanol, or 1-dodecanol.

In an embodiment, the coating of the surface of the substrate with the nanostructure ink may be performed using a slot die, a Meyer rod, or a doctor blade.

In an embodiment, the nanostructures may be formed of silver, copper, gold, ITO, ATO, or FTO.

In an embodiment, the nanostructures may have a nanowire structure or a core-shell structure.

In another aspect, a nanostructure network may include nanostructures having a poly-crystalline structure formed by self-assembly of the nanostructures.

In an embodiment, the nanostructures may have a light transmittance of 80% or more in a visible light region.

In an embodiment, the nanostructures may be fabricated without a patterning process.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 1 is a flowchart illustrating a method of fabricating a nanostructure network according to some embodiments of the inventive concepts.

FIGS. 2A to 2D are views illustrating a method of fabricating a nanostructure network according to some embodiments of the inventive concepts.

FIG. 3 shows scanning electron microscope (SEM) images of a process of fabricating a nanostructure network according to some embodiments of the inventive concepts.

FIG. 4 shows images of nanostructures forming a nanostructure network according to some embodiments of the inventive concepts.

FIG. 5 shows SEM images of nanostructure networks fabricated according to some embodiments of the inventive concepts.

FIG. 6 is a graph showing measured transmissions (or transmittances) of nanostructure networks fabricated according to some embodiments of the inventive concepts.

FIG. 7 shows SEM images of nanostructure networks fabricated according to comparative examples and some embodiments of the inventive concepts.

FIG. 8 shows graphs of measured transmissions (or transmittances) of nanostructure networks fabricated according to comparative examples and some embodiments of the inventive concepts.

FIG. 9 is a graph showing measured sheet resistances of nanostructure networks fabricated according to comparative examples and some embodiments of the inventive concepts.

FIG. 10 shows measurement images of a contact angle depending on a surface pretreatment of a substrate in a method of fabricating a nanostructure network according to some embodiments of the inventive concepts.

FIG. 11 shows SEM images of nanostructure networks fabricated according to some embodiments of the inventive concepts.

FIG. 12 is a graph showing measured transmissions (or transmittances) of nanostructure networks fabricated according to some embodiments of the inventive concepts.

FIG. 13 shows images of an electrical conductivity test of a transparent electrode using a nanostructure network fabricated according to some embodiments of the inventive concepts.

DETAILED DESCRIPTION OF THE EMBODIMENTS

The inventive concepts will now be described more fully hereinafter with reference to the accompanying drawings, in which exemplary embodiments of the inventive concepts are shown. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts.

It will be understood that when an element such as a layer, region or substrate is referred to as being "on" another element, it can be directly on the other element or intervening elements may be present. In addition, in the drawings, the thicknesses of layers and regions are exaggerated for clarity.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. As used herein, the term "and/or" includes any and all combinations of one or more of the associated listed items.

The terminology used herein is for the purpose of describing particular embodiments only and is not intended to limit the invention. As used herein, the singular terms "a", "an" and "the" are intended to include the plural forms as well, unless the context clearly indicates otherwise. It will be further understood that the terms "comprises", "comprising", "includes", "including", "have", "has" and/or "having" when used herein, specify the presence of stated features, integers, steps, operations, elements, and/or components, but do not preclude the presence or addition of one or more other features, integers, steps, operations, elements, components, and/or groups thereof. Furthermore, it will be understood that when an element is referred to as being "connected" or "coupled" to another element, it may be directly connected or coupled to the other element or intervening elements may be present.

In addition, in explanation of the present invention, the descriptions to the elements and functions of related arts may be omitted if they obscure the subjects of the inventive concepts.

FIG. 1 is a flowchart illustrating a method of fabricating a nanostructure network according to some embodiments of the inventive concepts, and FIGS. 2A to 2D are views illustrating a method of fabricating a nanostructure network according to some embodiments of the inventive concepts.

Referring to FIGS. 1 and 2A to 2D, a nanostructure solution in which nanostructures 110 are dispersed in a first solvent may be prepared (S110). In some embodiments, the nanostructures 110 may be nanowires or core-shell structures. In certain embodiments, the nanostructures 110 may be formed of silver, copper, gold, ITO, ATO, or FTO. For example, the nanostructures 110 may be silver nanowires, and a concentration of the nanostructure solution may range from 0.1 wt % to 3.0 wt %. For another example, the nanostructure solution may be a 0.5 wt % silver nanowire aqueous solution purchased from NANOPYXIS Co., Ltd. In an embodiment, the first solvent may be distilled water.

A nanostructure ink may be formed by adding the nanostructure solution into a second solvent having a viscosity higher than that of the first solvent (S120). In an embodiment, the formed nanostructure ink may be treated with ultrasonic waves for 1 minute. In some embodiments, the viscosity of the second solvent may be higher than that of the first solvent, and a vapor pressure of the second solvent may be lower than that of the first solvent.

For example, the second solvent may include at least one of α-terpineol, cyclohexanol, or 1-dodecanol. In some embodiments, an affinity of the nanostructures 110 for the first solvent may be higher than an affinity of the nanostructures 110 for the second solvent. Thus, when the nanostructure ink is divided into the first solvent and the second solvent, the first solvent and the second solvent may be separated from each other in a state where the nanostructures 110 are dispersed in the first solvent. In some embodiments, an affinity between the first solvent and the second solvent may be low.

In some embodiments, the nanostructure ink may further include an admixture 124 for mixing the first solvent and the second solvent. Thus, the first solvent and the second solvent may be easily and uniformly mixed with each other by the admixture 124 even though the affinity between the first and second solvents is low. As a result, even though the affinity of the nano structures 110 for the first solvent is different from the affinity of the nanostructures 110 for the second solvent, the nanostructures 110 may be uniformly dispersed in the whole of the nanostructure ink. A viscosity of the admixture 124 may be lower than those of the first and second solvents, and a vapor pressure of the admixture 124 may be higher than those of the first and second solvents. The admixture 124 may have excellent affinities for the first solvent and the second solvent. For example, the admixture 124 may be methanol.

A surface of a substrate 150 may be coated with the nanostructure ink (S130). In some embodiments, the method of coating the surface of the substrate 150 with the nanostructure ink may use a slot die, a Meyer rod, or a doctor blade. For example, the substrate 150 may be a PET film. In some embodiments, after the coating process, the substrate 150 coated with the nanostructure ink may be dried at room temperature for 1 minute.

In some embodiments, the coating layer in a liquid state, which is formed by coating the substrate 150 with the nanostructure ink, may be divided into a plurality of first droplets 130 spaced apart from each other. In detail, when the coating layer is formed by the coating process of the nanostructure ink, the first droplets 130 may be formed by the high viscosity of the second solvent included in the nanostructure ink.

In some embodiments, the surface of the substrate 150 may be pretreated before the surface of the substrate 150 is coated with the nanostructure ink. For example, the surface of the substrate 150 may be pretreated with oxygen plasma, and the surface of the substrate 150 may be converted into a hydrophilic surface. Thus, adhesion between the substrate 150 and the nanostructure ink may be improved by a polar group of the substrate 150, and the nanostructure ink may be uniformly coated on the substrate 150.

A nanostructure network may be formed by evaporating the first solvent and the second solvent included in the nanostructure ink on the substrate 150 (S140). In some embodiments, the first droplet 130 may include the first solvent, the second solvent, and the nanostructures 110. The first and second solvents included in the first droplet 130 on the substrate 150 may be evaporated, and the nanostructures 110 may be self-assembled into a poly-crystalline structure while forming a plurality of cell shapes, thereby forming the nanostructure network. In some embodiments, the nanostructure network formed on the substrate 150 may be dried at 70 degrees Celsius. In some embodiments, to remove the first solvent or the second solvent remaining on the substrate 150, the substrate 150 may be immersed in alcohol (e.g., methanol) for 10 minutes and then may be heated at 150 degrees Celsius for 1 hour.

In some embodiments, the first droplet 130 formed on the substrate 150 may further include the admixture 124 in addition to the nanostructures 110, the first solvent, and the second solvent. The admixture 124 may have the vapor pressure higher than those of the first and second solvents, and thus the admixture 124 may be first evaporated from the first droplet 130 to form a second droplet 132, as illustrated in FIG. 2B.

In some embodiments, the second droplet 132 may be divided into a central portion 140 and a peripheral portion 142, as illustrated in FIG. 2C. In detail, since the admixture 124 uniformly mixing the first and second solvents having the low affinity for each other is evaporated, the first and second solvents may not be uniformly mixed with each other but may be partially separated from each other. For example, a concentration of the first solvent may be lower than a concentration of the second solvent in the central portion 140, and a concentration of the first solvent may be higher than a concentration of the second solvent in the peripheral portion 142. In detail, due to viscous force of the second solvent having the viscosity higher than that of the first solvent, the second solvent may have a high concentration in the central portion 140, and the first solvent may have a high concentration in the peripheral portion 142. For example, a concentration of the nanostructures 110 in the central portion 140 may be lower than a concentration of the nanostructures 110 in the peripheral portion 142.

In some embodiments, the first solvent included in the second droplet 132 may be evaporated to form a third droplet. The vapor pressure of the first solvent may be higher than that of the second solvent, and thus the first solvent may be evaporated prior to the second solvent. Since the first solvent is evaporated, the nanostructures 110 mainly included in the first solvent may remain in the peripheral portion 142. Since the second solvent included in the third droplet is evaporated, the nanostructures 110 remaining in the peripheral portion 142 may be self-assembled into the poly-crystalline structure while forming the plurality of cell shapes, thereby forming the nanostructure network, as illustrated in FIG. 2D.

In some embodiments, an average size of the plurality of cells of the nanostructure network may be adjusted by a content or viscosity of the second solvent. For example, the average size of the plurality of cells may increase as the content of the second solvent increases or as the viscosity of the second solvent decreases. For example, the average size of the plurality of cells may decrease as the content of the second solvent decreases or as the viscosity of the second solvent increases.

According to the embodiments of the inventive concepts, the nanostructure network may have the poly-crystalline structure in which the plurality of cell shapes is formed by the self-assembly of the nanostructures 110. Thus, the nanostructure network with high transmittance (or transmission) may be provided.

Unlike the embodiments of the inventive concepts, a random nanostructure network which does not have the poly-crystalline structure including the plurality of cell shapes formed by the self-assembly of the nanostructures 110 may have nanostructures randomly distributed on the whole of a substrate, and thus a transmittance of the random nanostructure network may be reduced. Accordingly, it may be difficult to apply the random nanostructure network to a transparent electrode requiring a high transmittance.

However, according to the embodiments of the inventive concepts, the nanostructures 110 may be self-assembled to form the poly-crystalline structure having the plurality of cell shapes, and thus the nanostructure network with the high transmittance may be provided or realized.

The method of fabricating the nanostructure network according to the embodiments of the inventive concepts may include forming the nanostructure ink including the first and second solvents in which the nanostructures 110 are dispersed, and the nanostructure ink may form the droplet on the substrate 150. The droplet may include the central portion 140 and the peripheral portion 142, and the nanostructures 110 may exist at the high concentration in the peripheral portion 142. Since the first solvent and the second solvent are evaporated, the nanostructures 110 may be self-assembled to form the nanostructure network and may remain on the substrate 150. Thus, the method of fabricating the nanostructure network having the poly-crystalline structure in which the plurality of cell shapes is formed may be provided or realized.

Unlike the embodiments of the inventive concepts, if the nanostructure ink does not form the droplet on the substrate 150 and the nanostructures 110 are not self-assembled into the poly-crystalline structure in which the plurality of cell shapes is formed by the nanostructures 110 in the peripheral portion 142 of the droplet, the nanostructures 110 may be self-assembled in a random structure. A nanostructure network in which the nanostructures 110 are self-assembled in the random structure may require a large amount of the nanostructures 110 to maintain desired electrical characteristics, and thus a density of the nanostructures 110 may be increased and a transmittance may be reduced. Therefore, the nanostructure network in which the nanostructures 110 are self-assembled in the random structure may not be used in a transparent electrode requiring a high transmittance. Alternatively, if a patterning process is performed to fabricate a nanostructure network having a certain shape unlike the embodiments of the inventive concepts, fabrication processes may be complicated and a fabrication cost may be increased.

However, according to the embodiments of the inventive concepts, the nanostructure ink may form the droplet including the central portion 140 and the peripheral portion 142 on the substrate 150, and the nanostructures 110 may be self-assembled in the peripheral portion 142 by evaporating the first and second solvents from the droplet, thereby forming the nanostructure network. Thus, it is possible to fabricate the nanostructure network having the poly-crystalline structure in which the plurality of cell shapes is formed. In addition, the sizes of the plurality of cells may be adjustable, and thus it is possible to fabricate the nanostructure network having the plurality of cells having sizes optimized for its use, and a transparent electrode using the nanostructure network. Furthermore, according to the embodiments of the inventive concepts, the process of fabricating the nanostructure network may be simple, and the fabrication cost of the nanostructure network may be reduced.

FIG. 3 shows scanning electron microscope (SEM) images of a process of fabricating a nanostructure network according to some embodiments of the inventive concepts.

Referring to FIG. 3, a 0.5 wt % nanostructure solution in which 2.5 g of silver nanowires were dispersed in a first solvent was prepared. A nanostructure ink was formed by adding the nanostructure solution to 1.5 g of a second solvent including 6 g of an admixture. A substrate was coated with the nanostructure ink by using a Meyer rod, and a formation process of a nanostructure network was checked. The nanostructure ink was uniformly coated on the substrate. Formation of a plurality of cells was started at 15 seconds after the coating of the nanostructure ink. Within 15 seconds after the nanostructure ink was coated on the substrate, the admixture was evaporated and the second solvent began to form droplets. At 40 seconds after the coating of the nanostructure ink, nanostructures (i.e., the silver nanowires) were self-assembled into a poly-crystalline structure while forming a plurality of cell shapes, thereby forming a nanostructure network.

FIG. 4 shows images of nanostructures forming a nanostructure network according to some embodiments of the inventive concepts.

Referring to FIG. 4, an image (a) is an image of a silver nanowire aqueous solution, and an image (b) is a SEM image of the silver nanowire aqueous solution of the image (a). It is recognized that silver nanowires are well dispersed in the aqueous solution.

Fabrication of Nanostructure Networks According to Embodiments 1 to 3

2.5 g of a 0.5 wt % silver nanowire aqueous solution purchased from NANOPYXIS Co. Ltd., 0.5 g of 90% α-terpineol purchased from Sigma Aldrich, Inc., and 7.0 g of methanol were mixed with each other to form a nanostructure ink, and the nanostructure ink was treated with ultrasonic waves for 1 minute. A surface of a PET film was pretreated with oxygen plasma for 10 seconds, and the nanostructure ink was coated on the PET film by using a Meyer rod. The PET film coated with the nanostructure ink was dried at 70 degrees Celsius, was immersed in methanol for 10 minutes, and then, was thermally treated at 150 degrees Celsius for 1 hour, thereby fabricating a nanostructure network according to an embodiment 1.

A nanostructure network according to an embodiment 2 was fabricated by changing the amount of α-terpineol to 1.5 g and changing the amount of methanol to 6.0 g in the method of fabricating the nanostructure network according to the embodiment 1 described above.

A nanostructure network according to an embodiment 3 was fabricated by changing the amount of α-terpineol to 2.5 g and changing the amount of methanol to 5.0 g in the method of fabricating the nanostructure network according to the embodiment 1 described above.

FIG. 5 shows SEM images of nanostructure networks fabricated according to some embodiments of the inventive concepts, and FIG. 6 is a graph showing measured transmissions (or transmittances) of nanostructure networks fabricated according to some embodiments of the inventive concepts.

Referring to FIG. 5 and the following table 1, it may be recognized that nanostructures (i.e., silver nanowires) are self-assembled into a poly-crystalline structure while forming a plurality of cell shapes in the nanostructure networks fabricated according to the embodiments 1 to 3. A SEM image (a) shows the nanostructure network according to the embodiment 1, a SEM image (b) shows the nanostructure network according to the embodiment 2, and a SEM image (c) shows the nanostructure network according to the embodiment 3. It is recognized that an average size of the plurality of cells increases as a content of α-terpineol used as a second solvent increases.

Referring to FIG. 6 and the following table 1, the nanostructure networks fabricated according to the embodiments 1 to 3 have transmissions (or transmittances) of 90% or more in a visible light region. The transmissions (or transmittances) of the nanostructure networks fabricated according to the embodiments 1 to 3 have relatively uniform values regardless of the content of α-terpineol used as the second solvent.

TABLE 1

| Classification | α-terpineol (g) | Average size of a plurality of cells (μm) | Transmission (%) @550 nm | Sheet resistance (Ω/sq) |
| --- | --- | --- | --- | --- |
| Embodiment 1 | 0.5 | 6.71 ± 1.87 | 91.22 | 54.17 ± 7.12 |
| Embodiment 2 | 1.5 | 31.43 ± 3.44 | 92.64 | 50.71 ± 4.75 |
| Embodiment 3 | 2.5 | 126.06 ± 27.88 | 93.06 | 56.88 ± 15.08 |

Referring to the table 1, sheet resistances of the nanostructure networks fabricated according to the embodiments 1 to 3 were measured using a four-point probe. The sheet resistances of the nanostructure networks fabricated according to the embodiments 1 to 3 are substantially constant at about 50Ω/sq regardless of the content of α-terpineol used as the second solvent.

The nanostructure networks fabricated according to the embodiments 1 to 3 include the same amount of the silver nanowires and include different amounts of α-terpineol. Referring to FIGS. 5 and 6 and the table 1, the average size of the plurality of cells increases as the content of α-terpineol increases, and the transmission (or transmittance) and the sheet resistance have relatively constant values even though the content of α-terpineol increases. Thus, it is recognized that the average size of the plurality of cells of the nanostructure network is adjusted by the content of the second solvent.

Fabrication of Nanostructure Networks According to Embodiments 4 to 8

2.5 g of a 0.1 wt % silver nanowire aqueous solution purchased from NANOPYXIS Co. Ltd., 2.5 g of 90% α-terpineol purchased from Sigma Aldrich, Inc., and 5.0 g of methanol were mixed with each other to form a nanostructure ink, and the nanostructure ink was treated with ultrasonic waves for 1 minute. A surface of a PET film was pretreated with oxygen plasma for 10 seconds, and the nanostructure ink was coated on the PET film by using a Meyer rod. The PET film coated with the nanostructure ink was dried at 70 degrees Celsius, was immersed in methanol for 10 minutes, and then, was thermally treated at 150 degrees Celsius for 1 hour, thereby fabricating a nanostructure network according to an embodiment 4.

A nanostructure network according to an embodiment 5 was fabricated by changing a concentration of the silver nanowire aqueous solution to 0.25 wt % in the method of fabricating the nanostructure network according to the embodiment 4 described above.

A nanostructure network according to an embodiment 6 was fabricated by changing a concentration of the silver nanowire aqueous solution to 0.5 wt % in the method of fabricating the nanostructure network according to the embodiment 4 described above.

A nanostructure network according to an embodiment 7 was fabricated by changing a concentration of the silver nanowire aqueous solution to 1.5 wt % in the method of fabricating the nanostructure network according to the embodiment 4 described above.

A nanostructure network according to an embodiment 8 was fabricated by changing a concentration of the silver nanowire aqueous solution to 3.0 wt % in the method of fabricating the nanostructure network according to the embodiment 4 described above.

Fabrication of Nanostructure Networks According to Comparative Examples 1 to 5

2.5 g of a 0.1 wt % silver nanowire aqueous solution purchased from NANOPYXIS Co. Ltd. and 7.5 g of methanol were mixed with each other to form a nanostructure ink, and the nanostructure ink was treated with ultrasonic waves for 1 minute. A surface of a PET film was pretreated with oxygen plasma for 10 seconds, and the nanostructure ink was coated on the PET film by using a Meyer rod. The PET film coated with the nanostructure ink was dried at 70 degrees Celsius, was immersed in methanol for 10 minutes, and then, was thermally treated at 150 degrees Celsius for 1 hour, thereby fabricating a nanostructure network according to a comparative example 1.

A nanostructure network according to a comparative example 2 was fabricated by changing a concentration of the silver nanowire aqueous solution to 0.25 wt % in the method of fabricating the nanostructure network according to the comparative example 1 described above.

A nanostructure network according to a comparative example 3 was fabricated by changing a concentration of the silver nanowire aqueous solution to 0.5 wt % in the method of fabricating the nanostructure network according to the comparative example 1 described above.

A nanostructure network according to a comparative example 4 was fabricated by changing a concentration of the silver nanowire aqueous solution to 1.5 wt % in the method of fabricating the nanostructure network according to the comparative example 1 described above.

A nanostructure network according to a comparative example 5 was fabricated by changing a concentration of the silver nanowire aqueous solution to 3.0 wt % in the method of fabricating the nanostructure network according to the comparative example 1 described above.

FIG. 7 shows SEM images of nanostructure networks fabricated according to comparative examples and some embodiments of the inventive concepts, and FIG. 8 shows graphs of measured transmissions (or transmittances) of nanostructure networks fabricated according to comparative examples and some embodiments of the inventive concepts.

Referring to FIG. 7, silver nanowires were self-assembled into a poly-crystalline structure while forming a plurality of cell shapes in the nanostructure networks fabricated according to the embodiments 4 to 8. On the contrary, silver nanowires were randomly disposed in the nanostructure networks fabricated according to the comparative examples 1 to 5. The nanostructure networks according to the embodiments 4 to 8 were fabricated using different concentrations of the silver nanowire aqueous solutions and the same amount of α-terpineol. Average sizes of the plurality of cells of the nanostructure networks fabricated according to the embodiments 4 to 8 are substantially constant at about 30 μm.

FIG. 8 shows transmissions (or transmittances) of the nanostructure networks fabricated according to the comparative examples 1 to 5 and the nanostructure networks fabricated according to the embodiments 4 to 8. A graph (a)

shows measured transmissions of the nanostructure networks fabricated according to the embodiments 4 to 8, and a graph (b) shows measured transmissions of the nanostructure networks fabricated according to the comparative examples 1 to 5.

The nanostructure networks fabricated according to the embodiments 4 to 8 include different concentrations of silver nanowires and the same amount of α-terpineol. Referring to FIGS. 7 and 8, the average sizes of the plurality of cells are relatively uniformly maintained at about 30 μm, and the transmission decreases as a content of the silver nanowires increases. Thus, it is recognized that the transmission (or transmittance) of the nanostructure network is adjusted by a content of the nano structures.

Referring to FIGS. 5 and 7, the average size of the plurality of cells of the nanostructure network is adjusted depending on the content of α-terpineol. In detail, the average size of the plurality of cells of the nanostructure network increases as the content of α-terpineol increases, and the average size of the plurality of cells of the nanostructure network decreases as the content of α-terpineol decreases.

Referring to FIGS. 6 and 8, the transmission (or transmittance) of the nanostructure network is adjusted depending on the content of the silver nanowires. In detail, the transmission of the nanostructure network decreases as the content of the silver nanowires increases, and the transmission of the nanostructure network increases as the content of the silver nanowires decreases.

FIG. 9 is a graph showing transmittances according to sheet resistances of nanostructure networks fabricated according to comparative examples and some embodiments of the inventive concepts.

Referring to FIG. 9, a performance index ($\sigma_{DC}/\sigma_{OP}$) of the nanostructure network (cell shaped self-assembly) according to the embodiment of the inventive concepts is 218.6 and is greater than a performance index (i.e., 146.0) of the nanostructure network (random self-assembly) according to the comparative example. In detail, the performance index used to evaluate a performance of the nanostructure network used as a transparent electrode may be represented as a ratio of a DC electrical conductivity ($\sigma_{DC}$) to an optical electrical conductivity ($\sigma_{OP}$). Referring to a graph inserted in FIG. 9, the performance index may be represented as a ratio of the DC electrical conductivity ($T^{-1/2}-1$) to the optical electrical conductivity ($1/R_S$).

FIG. 10 shows measurement images of a contact angle depending on a surface pretreatment of a substrate in a method of fabricating a nanostructure network according to some embodiments of the inventive concepts.

Referring to FIG. 10, a contact angle between a substrate and a nanostructure ink is changed depending on whether or not a surface of the substrate is pretreated before the nanostructure ink is coated on the substrate. The surface of the substrate is pretreated with oxygen plasma, and the surface of the substrate is converted into a hydrophilic surface by the pretreatment process. An image (a) shows a measured contact angle of a case in which the surface of the substrate was pretreated and then was coated with the nanostructure ink, and an image (b) shows a measured contact angle of a case in which the surface of the substrate was not pretreated and was coated with the nanostructure ink. In the case in which the surface of the substrate is not pretreated, the contact angle between the nanostructure ink and the substrate is 74.22 degrees. In the case in which the surface of the substrate is pretreated, the contact angle between the nanostructure ink and the substrate is reduced to 34.68 degrees. Thus, when the surface of the substrate is converted into the hydrophilic surface by the pretreatment, adhesion between the surface of the substrate and the nanostructure ink may be increased by polar groups (e.g., hydroxyl (OH), carboxyl (COOH), and/or carbonyl (CO)) of the surface of the substrate. As a result, the surface of the substrate may be uniformly coated with the nanostructure ink without agglomeration.

Fabrication of Nanostructure Networks According to Embodiments 9 to 11

2.5 g of a 0.5 wt % silver nanowire aqueous solution purchased from NANOPYXIS Co. Ltd., 1.5 g of 90% α-terpineol purchased from Sigma Aldrich, Inc., and 5.0 g of methanol were mixed with each other to form a nanostructure ink, and the nanostructure ink was treated with ultrasonic waves for 1 minute. A surface of a PET film was pretreated with oxygen plasma for 10 seconds, and the nanostructure ink was coated on the PET film by using a Meyer rod. The PET film coated with the nanostructure ink was dried at 70 degrees Celsius, was immersed in methanol for 10 minutes, and then, was thermally treated at 150 degrees Celsius for 1 hour, thereby fabricating a nanostructure network according to an embodiment 9.

A nanostructure network according to an embodiment 10 was fabricated by replacing α-terpineol with cyclohexanol in the method of fabricating the nanostructure network according to the embodiment 9 described above.

A nanostructure network according to an embodiment 11 was fabricated by replacing α-terpineol with 1-dodecanol in the method of fabricating the nanostructure network according to the embodiment 9 described above.

FIG. 11 shows SEM images of nanostructure networks fabricated according to some embodiments of the inventive concepts, and FIG. 12 is a graph showing measured transmissions (or transmittances) of nanostructure networks fabricated according to some embodiments of the inventive concepts.

Referring to FIG. 11 and the following table 2, it may be recognized that nanostructures (i.e., silver nanowires) are self-assembled into a poly-crystalline structure while forming a plurality of cell shapes in the nanostructure networks fabricated according to the embodiments 10 and 11. A SEM image (a) shows the nanostructure network fabricated according to the embodiment 10, and a SEM image (b) shows the nanostructure network fabricated according to the embodiment 11. The nanostructure networks according to the embodiments 9 to 11 were fabricated using different kinds of materials as the second solvents, and at this time, the amounts of the materials were equal to each other. A plurality of cells of the nanostructure network of the embodiment 10 using cyclohexanol having the highest viscosity as the second solvent has the smallest average size, and a plurality of cells of the nanostructure network of the embodiment 11 using 1-dodecanol having the lowest viscosity has the largest average size.

Referring to FIG. 12 and the following table 2, the nanostructure networks fabricated according to the embodiments 9 to 11 have transmissions (or transmittances) of 90% or more in a visible light region. It is recognized that the transmission of the nanostructure network slightly decreases as the viscosity of the material used as the second solvent increases.

TABLE 2

| Classification | Second solvent | | Average size of a plurality of cells (μm) | Transmission (%) @550 nm | Sheet resistance (Ω/sq) |
| --- | --- | --- | --- | --- | --- |
| | Kind | Viscosity (cP) | | | |
| Embodiment 9 | α-terpineol | 36.5 | 31.43 ± 3.44 | 92.64 | 50.71 ± 4.75 |
| Embodiment 10 | Cyclohexanol | 41.07 | 35.69 ± 5.82 | 91.55 | 40.44 ± 7.16 |
| Embodiment 11 | 1-Dodecanol | 18.8 | 65.10 ± 9.78 | 94.81 | 51.93 ± 9.51 |

FIG. 13 shows images of an electrical conductivity test of a transparent electrode using a nanostructure network fabricated according to some embodiments of the inventive concepts.

Referring to FIG. 13, a flow of a current was checked using the nanostructure network fabricated according to the embodiment of the inventive concepts as a transparent electrode. A LED lamp was turned on by applying a voltage to the transparent electrode. Even after the transparent electrode was folded or crumpled once or twice, the LED lamp was turned on by applying a voltage to the transparent electrode. Thus, it may be recognized that the nanostructure network fabricated according to the embodiment of the inventive concepts can be applied to a flexible transparent electrode.

The embodiments of the inventive concepts may provide the nanostructure network which has the plurality of cell shapes and is capable of reducing a fabrication time and a fabrication cost and of simplifying a fabrication process, and the method of fabricating the same.

According to the embodiments of the inventive concepts, the nanostructure network may have the poly-crystalline structure in which the plurality of cell shapes is formed by the self-assembly of the nanostructures. Thus, the nanostructure network with the high transmittance (or transmission) may be provided.

In addition, the method of fabricating the nanostructure network according to the embodiments of the inventive concepts may include forming the nanostructure ink including the first and second solvents in which the nanostructures are dispersed, and the nanostructure ink may form the droplet on the substrate. The droplet may include the central portion and the peripheral portion, and the nanostructures may exist at the high concentration in the peripheral portion. Since the first and second solvents are evaporated, the nanostructures may be self-assembled to form the nanostructure network and may remain on the substrate. Thus, the method of fabricating the nanostructure network having the poly-crystalline structure in which the plurality of cell shapes is formed may be provided or realized.

While the inventive concepts have been described with reference to exemplary embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of fabricating a nanostructure network, the method comprising:
   preparing a nanostructure solution in which nanostructures are dispersed in a first solvent;
   forming a nanostructure ink by adding the nanostructure solution into a second solvent having a viscosity higher than that of the first solvent and an admixture for mixing the first solvent and the second solvent;
   coating a surface of a substrate with the nanostructure ink; and
   forming a nanostructure network by evaporating the first solvent and the second solvent included in the nanostructure ink coated on the substrate,
   wherein the coating of the surface of the substrate with the nanostructure ink comprises:
     generating a coating layer in a liquid state on the substrate; and
     dividing the coating layer into a plurality of first droplets spaced apart from each other, and
   wherein the forming of the nanostructure network comprises:
     evaporating the admixture prior to the first solvent and the second solvent from the first droplet to form a second droplet;
     evaporating the first solvent prior to the second solvent from the second droplet to form a third droplet; and
     evaporating the second solvent from the third droplet.

2. The method of claim 1, wherein a vapor pressure of the first solvent is higher than a vapor pressure of the second solvent.

3. The method of claim 1,
   wherein a vapor pressure of the admixture is higher than vapor pressures of the first solvent and the second solvent.

4. The method of claim 1, wherein the second droplet includes a central portion and a peripheral portion,
   wherein a concentration of the first solvent is lower than a concentration of the second solvent in the central portion,
   wherein a concentration of the first solvent is higher than a concentration of the second solvent in the peripheral portion, and
   wherein a concentration of the nanostructures in the peripheral portion is higher than a concentration of the nanostructures in the central portion.

5. The method of claim 1, wherein an affinity between the first solvent and the nanostructures is higher than an affinity between the second solvent and the nanostructures.

6. The method of claim 5, wherein the evaporating of the admixture prior to the first solvent and the second solvent from the first droplet to form the second droplet comprises:
   concentrating the nanostructures to an edge of the second droplet by a difference in affinity between the first solvent and the second solvent for the nanostructures.

7. The method of claim 1, wherein the nanostructures are self-assembled into a poly-crystalline structure while forming a plurality of cell shapes, thereby forming the nanostructure network, and
   wherein an average size of the plurality of cells is adjusted by a content or the viscosity of the second solvent.

8. The method of claim 7, wherein the average size of the plurality of cells increases as the content of the second solvent increases, and the average size of the plurality of cells decreases as the content of the second solvent decreases.

9. The method of claim 7, wherein the average size of the plurality of cells decreases as the viscosity of the second solvent increases, and the average size of the plurality of cells increases as the viscosity of the second solvent decreases.

10. The method of claim 1, further comprising:
pretreating the surface of the substrate to convert the surface into a hydrophilic surface, before the coating of the surface of the substrate with the nanostructure ink.

11. The method of claim 10, wherein the surface of the substrate is pretreated with oxygen plasma.

12. The method of claim 1, wherein the second solvent includes α-terpineol, cyclohexanol, or 1-dodecanol.

13. The method of claim 1, wherein the coating of the surface of the substrate with the nanostructure ink is performed using a slot die, a Meyer rod, or a doctor blade.

14. The method of claim 1, wherein the nanostructures are formed of silver, copper, gold, ITO, ATO, or FTO.

15. The method of claim 1, wherein the nanostructures have a nanowire structure or a core-shell structure.

16. The method of claim 1, wherein the nanostructures comprise silver nanowires.

17. The method of claim 1, wherein the substrate is transparent.

* * * * *